(12) United States Patent
Nguyen et al.

(10) Patent No.: US 6,884,066 B2
(45) Date of Patent: Apr. 26, 2005

(54) THERMAL PROCESS STATION WITH HEATED LID

(75) Inventors: Vuong P. Nguyen, Allen, TX (US); Richard E. Sims, DeSoto, TX (US); Xiaoguang Zhu, Plano, TX (US)

(73) Assignee: FSI International, Inc., Chaska, MN (US)

( * ) Notice: Subject to any disclaimer, the term of this patent is extended or adjusted under 35 U.S.C. 154(b) by 122 days.

(21) Appl. No.: 10/633,124

(22) Filed: Aug. 1, 2003

(65) Prior Publication Data

US 2004/0048220 A1 Mar. 11, 2004

Related U.S. Application Data

(60) Provisional application No. 60/409,561, filed on Sep. 10, 2002.

(51) Int. Cl.[7] .................................................. F27D 1/18
(52) U.S. Cl. ........................ 432/250; 432/253; 118/728; 219/457
(58) Field of Search .............................. 432/253, 258, 432/247, 237, 250; 392/416, 418; 118/725, 728; 219/444.1, 390, 405, 443.1, 457

(56) References Cited

U.S. PATENT DOCUMENTS

| | | |
|---|---|---|
| 5,462,603 A | 10/1995 | Murakami |
| 5,620,560 A | 4/1997 | Akimoto et al. |
| 5,772,770 A | 6/1998 | Suda et al. |
| 5,884,009 A | 3/1999 | Okase |
| 5,906,683 A * | 5/1999 | Chen et al. ................. 118/724 |
| 5,968,691 A | 10/1999 | Yoshioka et al. |
| 6,002,109 A | 12/1999 | Johnsgard et al. |
| 6,015,594 A | 1/2000 | Yoshikawa |
| 6,072,163 A | 6/2000 | Armstrong et al. |
| 6,198,074 B1 | 3/2001 | Savas |
| 6,215,106 B1 | 4/2001 | Boas et al. |
| 6,307,184 B1 | 10/2001 | Womack et al. |
| 6,394,797 B1 * | 5/2002 | Sugaya et al. .............. 432/253 |
| 6,416,318 B1 * | 7/2002 | Lee et al. .................... 432/247 |
| 6,423,947 B2 * | 7/2002 | Womack et al. ............ 219/390 |
| 6,600,138 B2 * | 7/2003 | Hauf et al. .................. 219/411 |
| 6,644,964 B2 * | 11/2003 | Shirakawa et al. ......... 432/253 |
| 2002/0132052 A1 | 9/2002 | Kumar et al. |

FOREIGN PATENT DOCUMENTS

| | | |
|---|---|---|
| EP | 0 843 347 | 5/1998 |
| JP | 05326453 | 12/1993 |
| JP | 08310896 | 11/1996 |
| JP | 10233370 | 9/1998 |

* cited by examiner

Primary Examiner—Gregory Wilson
(74) Attorney, Agent, or Firm—Kagan Binder, PLLC

(57) ABSTRACT

Methods and apparatuses to improve the temperature uniformity of a workpiece being processed on a heated platen of a thermal processing station. A heated platen is enclosed in a housing incorporating an additional heat source that uniformly outputs thermal energy into the process chamber in which the heated platen is positioned. In preferred embodiments, this heat source is positioned in the lid of the housing. It is additionally preferred that the heated lid includes features that provide a gas flow path to introduce to and/or purge gas from the process chamber. In terms of photoresist performance, the improved thermal uniformity provided by using such an additional heat source in the housing, e.g., in the lid, offers improved line width control and line uniformity across a wafer.

21 Claims, 6 Drawing Sheets

THERMAL PROCESS STATION WITH HEATED LID

CROSS-REFERENCE TO RELATED APPLICATIONS

The present non-provisional Application claims the benefit of commonly assigned provisional Application having Ser. No. 60/409,561, filed on Sep. 10, 2002, and entitled THERMAL PROCESS STATION WITH HEATED LID, which Application is incorporated herein by reference in its entirety.

FIELD OF THE INVENTION

The present invention relates to thermal processing stations used particularly in the manufacture of microelectronic devices and being of the type incorporating a heated platen on which a workpiece is thermally processed. More specifically, the present invention relates to such stations that incorporate a heated platen and an additional heat source.

BACKGROUND OF THE INVENTION

The manufacture of many products requires precise control over temperature and temperature changes. For example, the manufacture of microelectronic devices, such as integrated circuits, flat panel displays, thin film heads, and the like, involves applying a layer of some material, such as a photoresist, onto the surface of a substrate (such as a semiconductor wafer in the case of integrated circuits). Photoresists, in particular, must be baked and then chilled to set or harden selected portions of the photoresist during processing. The baking and chilling steps must be precisely controlled within exacting temperature constraints to ensure that the selected portions of the photoresist properly set with good resolution. Other products and processes involving exacting temperature constraints include medical products and processes including drug preparation, instrument sterilization, and bioengineering; accelerated life testing methodologies; injection molding operations; piezoelectric devices; photographic film processing; material deposition processes such as sputtering and plating processes; micromachine manufacture; ink jet printing; fuel injection; and the like.

Baking typically involves heating a workpiece up to a specific elevated, equilibrium temperature and then maintaining the workpiece at that particular equilibrium temperature for a defined period of time.

Typically, thermal treatment is accomplished by positioning a wafer on a heated platen, also referred to as a bake plate. The heated platen is housed inside an enclosure so that thermal treatment occurs in a protected environment that is isolated from the ambient. It is very important that thermal treatment be as uniform as possible over the full surface area of the wafer. Too much temperature variation over the wafer surface area can adversely impact the performance of the baked photoresist, and hence the quality of the resultant devices.

Thermal uniformity can be quantified in different ways. One suitable approach involves first measuring the surface temperature of the wafer, or of the heated platen that supports the wafer, at several representative points over the full surface of the wafer, or the platen, as the case may be. Thermal uniformity may then be calculated as the difference between the highest and lowest measured temperatures. A typical specification may require that this temperature variation be no more than a fraction of a degree Celsius, for example. As microelectronic devices get smaller and smaller, a trend which is driven by a strong demand for increased miniaturization, temperature uniformity specifications continue to become more stringent. Consequently, there is a continuing demand for more improvement in thermal uniformity.

Conventionally, a number of features have been incorporated into thermal processing stations in order to enhance thermal uniformity. One approach has involved improving the structure and/or features of the heated platen and its related components. Another approach has involved improving the temperature sensor and control systems for monitoring and/or regulating the platen temperature. Still yet another approach has involved enhancing the insulating characteristics of the housing and other components of the thermal processing station to help to thermally isolate the processing chamber from the ambient.

All of these approaches for improving thermal uniformity have been beneficial, yet there continues to be a demand for even better the thermal uniformity performance.

In the past, heating devices have been laminated onto the outside, top surface of a thermal processing station housing, e.g., the lid of the housing, in order to heat the housing and prevent process vapors from condensing on the inside surfaces of the process chamber. For instance, FSI International, Inc. has marketed one thermal processing station with a heated lid in connection with its POLARIS® series tool clusters. However, the heating device used to heat the lid was a flat, heated sheet that was laminated to an outside surface of the lid. Additionally, the lid structure included an alternating series of four relatively flat panels separated by ring structures. This defined a lid structure having, in effect, three stacked plenums constituting at least three air gaps in series between the entire surface area of the heater face at the top of the lid and the process chamber below the lid. Accordingly, this particular lid structure provided little, if any, direct, solid pathways for conducting thermal energy from the heater face uniformly to the process chamber below the heater. The only direct solid pathways for conducting thermal energy from the heater to the process chamber were the exterior side walls of the housing positioned proximal to the outer peripheral edge of the heating device. Moreover, the heating device was used to prevent condensation of the vapors inside the processing chamber and was not used to enhance thermal uniformity of the wafer being processed inside the chamber.

SUMMARY OF THE INVENTION

The present invention provides methods and apparatuses that improve the temperature uniformity of a workpiece being processed on a heated platen. The present invention is based upon enclosing the heated platen in a housing incorporating an additional heat source that uniformly outputs thermal energy into the process chamber in which the heated platen is positioned. In preferred embodiments, this heat source is positioned in the lid of the housing. It is additionally preferred that the heated lid includes features that provide a gas flow path to introduce to and/or purge gas from the process chamber. In terms of photoresist performance, the improved thermal uniformity provided by using such an additional heat source in the housing, e.g., in the lid, offers improved line width control and line uniformity across a wafer.

In one aspect of the present invention, a thermal process station includes an enclosed process chamber and an additional enclosed chamber. A heated platen can be positioned inside the enclosed process chamber and typically has a face over which a workpiece is positioned during a thermal treatment. An additional heat source can be positioned in the additional enclosed chamber to be in thermally conductive contact with the process chamber.

In another aspect of the present invention, a thermal process station includes a housing that includes a heated lid assembly and a bottom housing assembly that closably engages the heated lid assembly. The heated lid assembly includes a heat source positioned inside a lid chamber. The heat source typically has a heater face and can be positioned inside the lid chamber in a manner such that the heater face is in thermal contact with the process chamber. A process chamber inside the housing is typically defined at least in part by the heated lid assembly and the bottom housing assembly. A heated platen can be positioned inside the process chamber on which a workpiece can be supported during a thermal treatment.

In yet another aspect of the present invention, a thermal process station includes a heated lid assembly, a bottom housing assembly, a processing chamber, an inlet plenum system, and an outlet plenum system. The heated lid assembly can overly the bottom housing assembly and the processing chamber is typically defined at least in part by the bottom housing assembly. At least a portion of the inlet and exhaust plenum systems in the heated lid assembly can include a gas flow path in fluid communication with the processing chamber. At least one of the inlet and exhaust plenum systems can have a plurality of radial flow channels. In one embodiment, the radial flow channels differ dimensionally from each other in a manner that enhances a uniformity characteristic of a transfer of thermal energy from the heated lid assembly to the processing chamber.

Preferably, when a heat source is positioned in a chamber of a lid of a thermal process station of the present invention, the chamber has a head space above a top surface of the heat source.

In still another aspect of the present invention, a method is provided of improving the thermal uniformity of a workpiece during a thermal treatment. The method includes the steps of 1) providing a first heat source have a first heating face, 2) providing a second heat source having a second heating face, wherein the first and second heating faces are opposed to each other, and 3) positioning the workpiece between the first and second, opposed heating faces during at least a portion of the thermal treatment.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF THE PRESENTLY PREFERRED EMBODIMENTS

Figure 1:
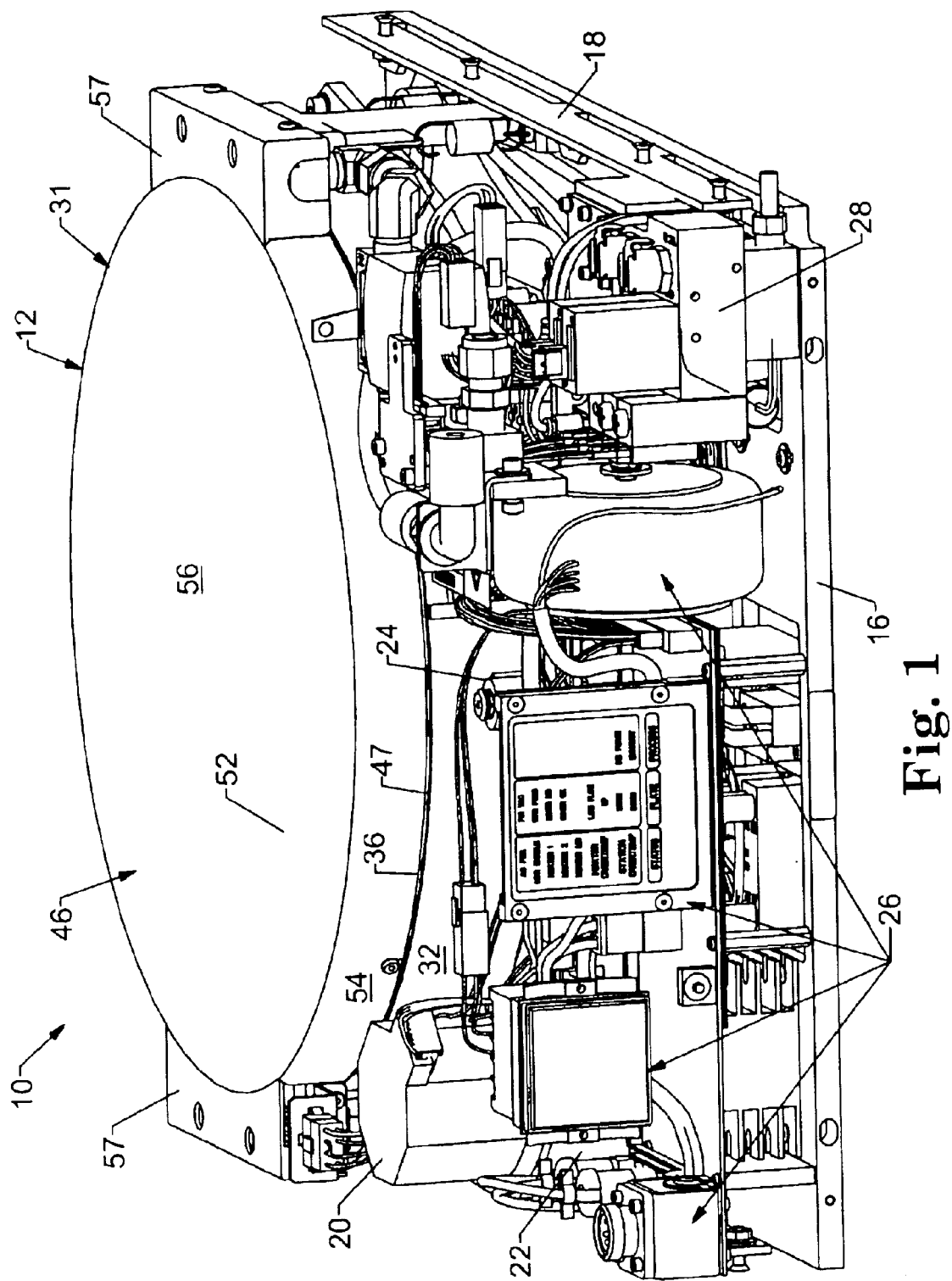
FIG. 1 is a perspective view of a thermal processing station of the present invention in which the heating unit is in a closed configuration.
Figure 2:
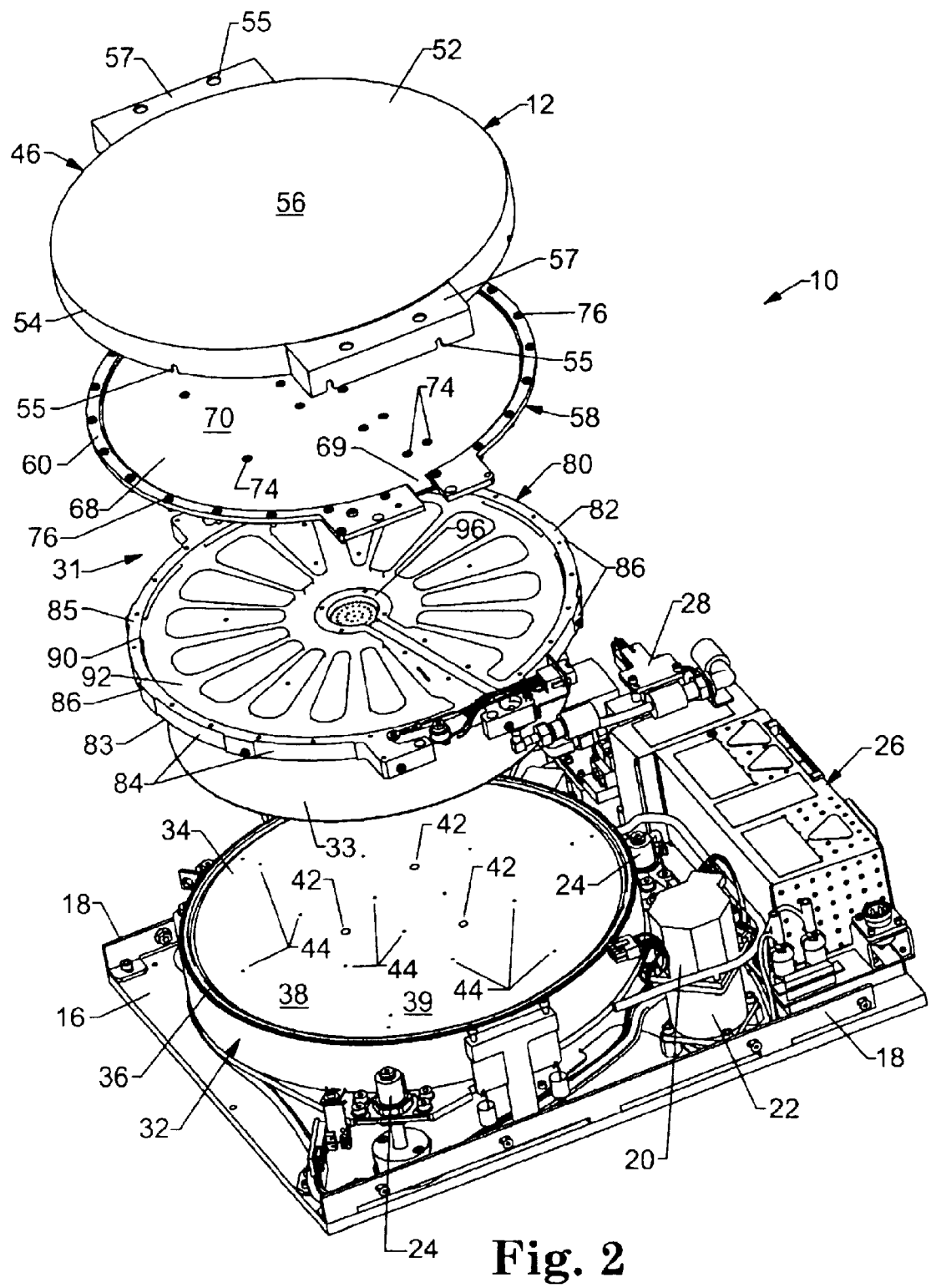
FIG. 2 is an exploded, perspective view of the thermal processing station of FIG. 1 better showing the components used to form the heated lid assembly.
Figure 3:
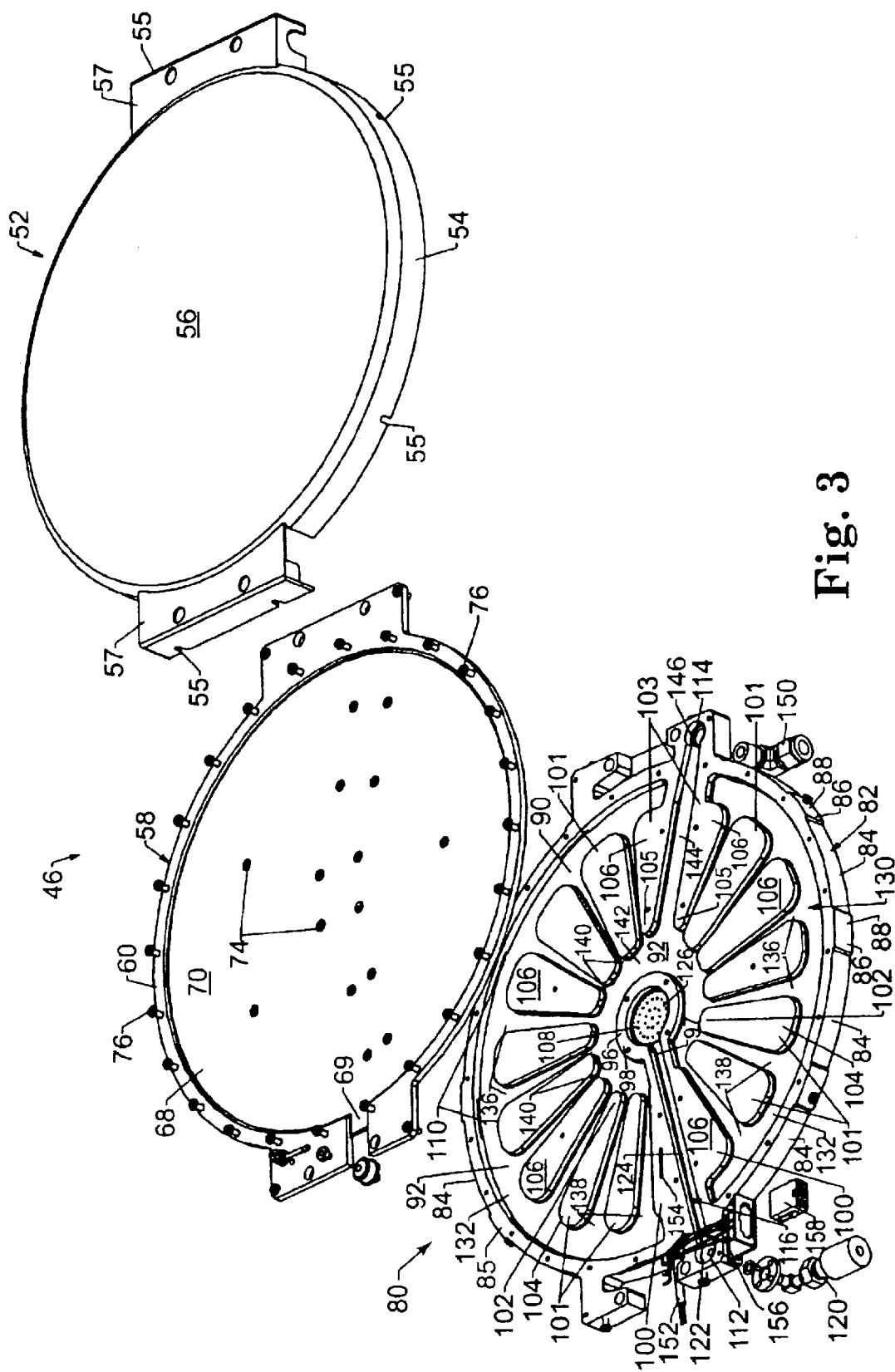
FIG. 3 is an exploded, perspective view of the heated lid assembly used in the thermal processing station of FIG. 1.
Figure 4:
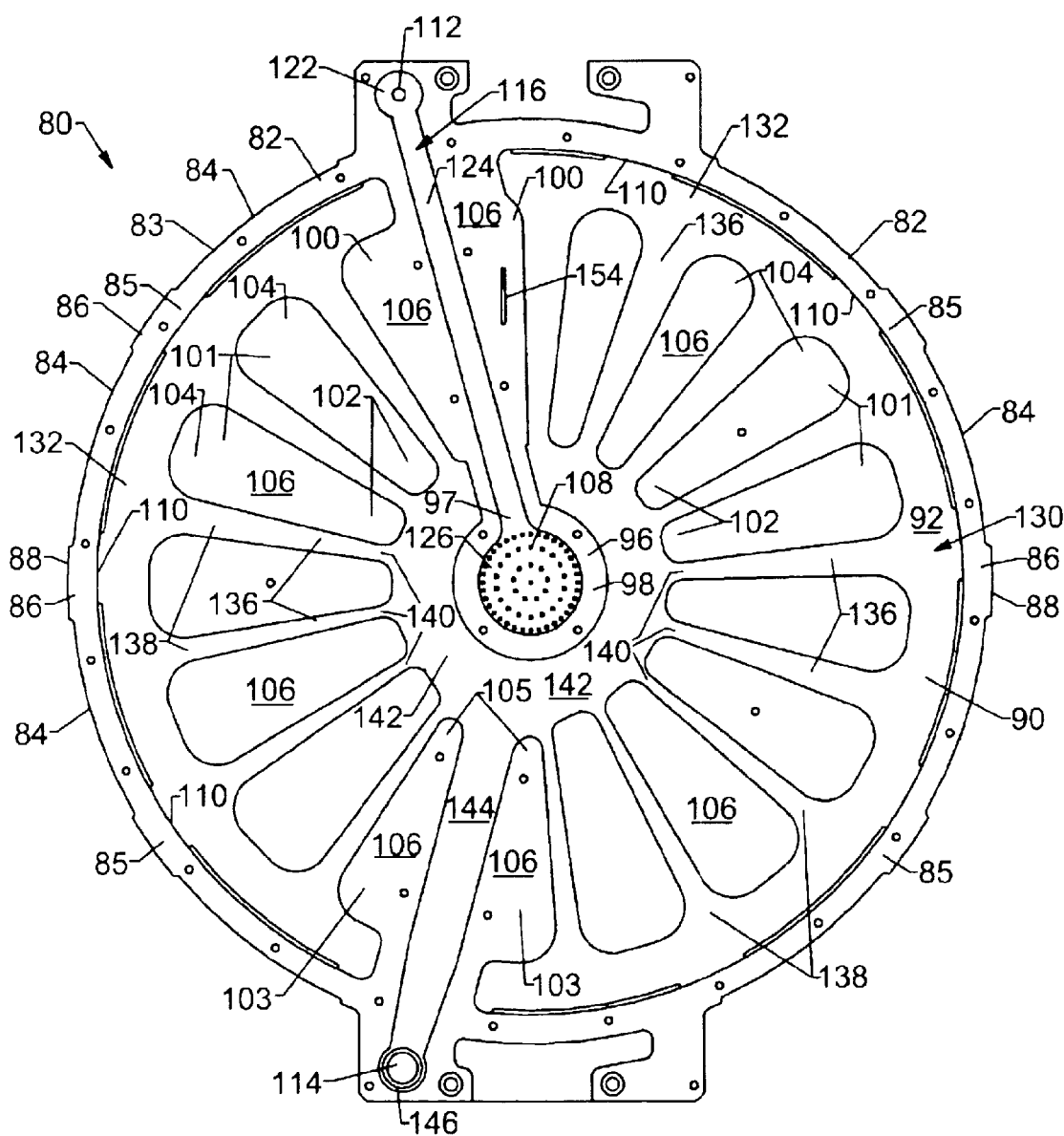
FIG. 4 is a plan, top view of the intermediate member used in the heated lid assembly of FIG. 3.
Figure 5:
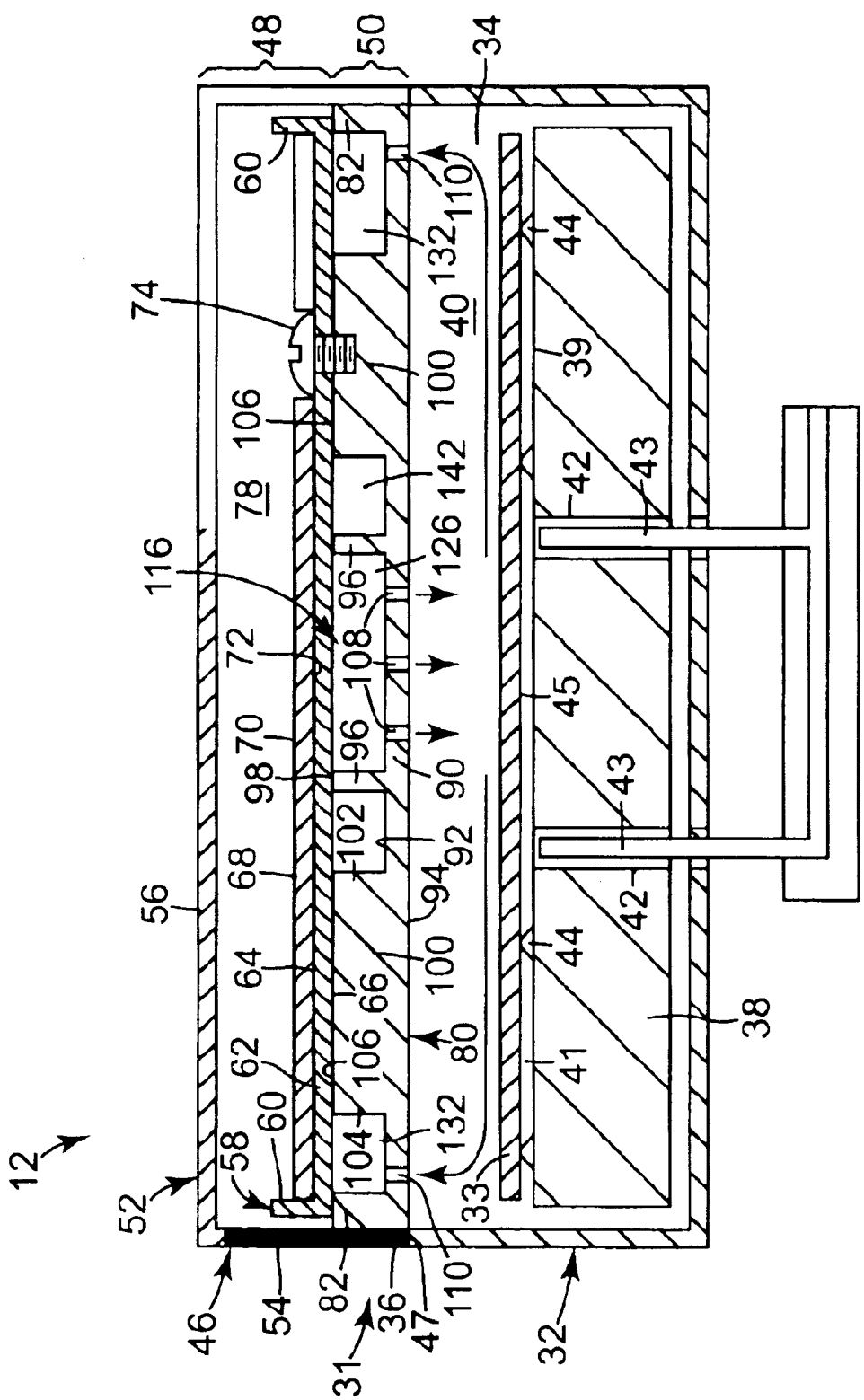
FIG. 5 is a schematic cross-section of the heating unit used in the thermal processing station of FIG. 1 better showing the flow of gas through the heated lid assembly and the processing chamber.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The principles of the present invention may be incorporated into a wide variety of different kinds of heating units in which it is desired to uniformly thermally process one or more microelectronic workpieces at one or more stages in the manufacture of microelectronic devices. For example, the principles of the present invention may be readily incorporated into any kind of priming or baking station used in the course of forming patterned or unpatterned photoresist layers on such workpieces.

For purposes of illustration, the present invention will be further exemplified in connection with a preferred thermal processing station 10 shown in FIGS. 1 through 5. This station 10 and its heating unit 12 advantageously are sized to handle microelectronic workpieces having a wide range of sizes, including those formed on 200 mm and 300 mm semiconductor wafer substrates. Station 10 as illustrated is supported upon support plate 16 including sliders 18 that facilitate modular mounting of station 10 into a modular cabinet of a cluster tool used for manufacturing microelectronic devices, such as the POLARIS® 2500 or POLARIS® 3000 series cluster tools available from FSI International, Inc., Chaska, Minn., and Allen, Tex. Although advantageously used as a station in such cluster tools, station 10 may be provided as a stand-alone system wherein station 10 and optionally support plate 16 and sliders 18 are supported and encased in a suitable housing (not shown).

In addition to the heating unit 12 itself and sliders 18, additional dedicated station componentry also is supported upon support plate 16. This componentry includes, for instance, a lift motor 20 and corresponding gear box 22 that are used during processing to open and close heating unit 12 for loading, unloading, calibration, service, or the like. Dedicated station electronics 26 are also provided. These electronics 26 include both hardware and software components. The dedicated station componentry included with the priming and baking stations currently commercially available on the POLARIS® brand tool clusters is representative of the kind of such supporting componentry that may be used in station 10. The station componentry incorporated into station 10 includes a manifold assembly 28 or the like that helps control the supply and/or removal of vacuum, process gases, and process vapors used by station 10.

The heating unit 12 has a housing 31 formed from a bottom housing assembly 32 and a heated lid assembly 46. The interior volume defined at least in part by bottom housing assembly 32 and heated lid assembly 46 define a process chamber 34. Housing 31 has an open configuration (not shown) and a closed configuration (as shown best in FIGS. 1 and 5). In the closed configuration, rim 36 of bottom housing assembly 32 engages rim 47 of heated lid assembly 46 to form a seal that isolates process chamber 34 from the surrounding environment. To help augment this environmental seal, heated lid assembly 46 is biased downward to enhance engagement between rims 36 and 47. In the open configuration, the bottom housing assembly 32 and the heated lid assembly 46 are separated sufficiently to provide access to and from process chamber 34.

Any suitable componentry may be used to open and close housing 31, as desired. For illustration purposes, relative movement between housing assembly 32 and heated lid assembly 46 is provided by lift motor 20 and gearbox 22, which are coupled to lift mechanisms 24 by a suitable driving mechanism (not shown), e.g., a drive chain, a drive belt, or the like. To close housing 31, lift motor 20, gearbox 22, and the driving mechanism are used to actuate lift mechanisms 24 so as to raise bottom housing assembly 32 so that rim 36 engages rim 47. To open housing 31, lift motor 20, gearbox 22, and the driving mechanism are used to actuate lift mechanisms 24 so as to lower bottom housing assembly 32 so that rims 36 and rim 47 are separated sufficiently to provide the desired egress into process chamber 34.

A heated platen 38 is positioned inside process chamber 34. A wafer 33 is supported above heated platen 38 during a process treatment in a manner such that thermal energy from heated platen 38 is effectively transferred to the wafer 33. Heated platen 38 includes conventional lift pin channels 42 through which wafer lift pins 43 project when bottom housing assembly 32 is lowered (i.e., housing 31 is open). The lift pins 43 are withdrawn into lift pin channels 42 when bottom housing assembly 32 is raised (i.e., housing 31 is closed).

Protuberances 44 (also known as proximity pins) are provided on the top surface 39 of heated platen 38 so that there is a small gap 41 between the underside 45 of wafer 33 and the top surface 39 of heated platen 38. This gap 41 helps to reduce contamination on the underside 45 of wafer 33 that might otherwise occur if there was a full surface contact between wafer 33 and heated platen 38. Yet, gap 41 is sufficiently small so that wafer 33 remains in thermal contact with heated platen 38. There is a headspace 40 inside process chamber 34 between the wafer 33 and the heated lid assembly 46. Heat energy from heated lid assembly 46 generally is conducted by heat lid assembly 46 into this headspace 40 via lid assembly structure that will be described in more detail below.

One preferred embodiment of a heated lid assembly 46 of the present invention, as illustrated in FIGS. 1 through 5, incorporates at least two functional stages. These stages are shown in the representative embodiment as an upper stage 48 and a lower stage 50, although the relative positioning of the two stages can be interchanged and/or integrated partly or wholly as desired. Upper stage 48 preferably houses one or more suitable heat sources such as a heated gas and/or a heater device, while lower stage 50 houses inlet and exhaust pathways through which one or more process gases may be collectively or independently conveyed to and from process chamber 34 during a process treatment. Lower stage 50 also includes solid structures that help directly conduct thermal energy from the heat source to headspace 40 in process chamber 34. These solid structures also serve an additional function of helping to define chambers and channels within lower stage 50 through which one or more process gases may be conveyed during processing operations.

In more detail, cover member 52 of heated lid assembly 46 includes peripheral sidewall 54 that extends downward from face panel 56. Additional peripheral cover structures 57 extend outward from peripheral sidewall 54 to match the footprint and thereby fit over other corresponding structures of the heated lid assembly 46. Cover member 52 includes fastener holes 55 by which cover member 52 is secured to other componentry of heated lid assembly 46.

Intermediate cover member 58 of heated lid assembly 46 has a raised, peripheral flange 60 positioned on a face panel 62 having an upper surface 64 and a lower surface 66. Upper surface 64 is recessed within peripheral flange 60. A heat source in the form of a planar, electrically resistive, laminated heating device 68 is sized to fit on upper surface 64 inside peripheral flange 60. The area of heating device 68 may be as small or as large as desired, but is preferably substantially coextensive in size with the area of recessed, upper surface 64 inside peripheral flange 60 to provide more uniform, transfer (preferably via thermal conduction primarily) of the thermal energy from heating device 68 into process chamber 34.

Heating device 68 preferably may be formed from one or more independent heating devices, but preferably is provided in a form that outputs controllable, uniform thermal energy from at least substantially the full lower face 72 of the heating device 68. In some embodiments, heating device 68 may incorporate two or more independently controllable heating zones. In such embodiments, it is preferred that the heat output of each such zone is uniform and controllable from at least substantially the full surface area of the lower face of the zones. A preferred heating device 68 incorporates one or more etched, metal foils that are sandwiched between polyimide insulating layers. Electric energy may be conveyed to and from heater device 68 via wiring 156 that enters and exits heating device 68 at tab 69 via connector 158. Heating device 68 may be secured to bottom cover member 80 using any suitable approach including mechanical fasteners, glue, combinations of these, and the like. Securing the heating device 68 to the bottom cover member 80 provides good thermal conduction between the heating device 68 and the bottom cover member 80. For illustrative purposes, heating device 68 includes mechanical fasteners 74 by which heating device 68 may be secured to bottom covery member 80.

There is a headspace 78 between the upper surface 70 of heating device 68 and face panel 56 of cover member 52. This headspace 78 helps to insulatively isolate heating device 68 from face panel 56, and consequently from the ambient. More uniform, consistent, and controllable thermal output from heating device 68 results. Additionally, the headspace 78 provides a chamber into which gases may enter through recessed wall portions 84. Such edge venting of gases from process chamber 34 through recessed wall portions 84 into headspace 78 may be utilized to control the temperature uniformity of the heating device 68.

In practical effect, heating device 68 is housed within its own chamber with surface 64 being the chamber floor, panel 56 being the chamber ceiling, and sidewall 54 provides the chamber walls. Peripheral flange 60 of intermediate cover member 58 includes a plurality of apertures through which intermediate cover member 58 may be secured to other componentry of heated lid assembly 46 using suitable mechanical fasteners 76. As shown, peripheral flange 60 is secured to bottom cover member 80 by these fasteners 76 thus providing good thermal contact between flange 60 and bottom cover member 86.

Bottom cover member 80 includes a raised peripheral flange 82 having top surface 85 positioned on an upper surface 92 of face panel 90. Face panel 90 also has bottom surface 94 that forms one boundary of process chamber 34. Sidewall 83 of peripheral flange 82 has recessed wall portions 84 defining projecting wall portions 86. Projecting wall portions 86 have mounting surfaces 88 to which peripheral sidewall 54 of cover member 52 is attached when the components of heated lid assembly 46 are assembled. Consequently, sidewall 54 is spaced apart from recessed wall portions 84. The resultant gaps help to thermally isolate corresponding portions of sidewall 54 and face panel 56 from the interiors of upper and lower stages 48 and 50, which in turn helps to thermally isolate the interiors of upper and lower stages 48 and 50 from the ambient. More uniform, consistent, and controllable heating of the interior of heated lid assembly 46 results.

In addition to peripheral flange 82, additional raised features are also provided on upper surface 92 of face panel 90. These include a generally annular wall 96 located in a central region of face panel 90. Annular wall 96 has a gap 97 that functions as a portal for conveying gases inside annular wall 96 as will be described further below. Annular wall 96 has a top surface 98. Radial walls 100 extend in spaced apart fashion from gap 97 outward to peripheral flange 82. An aperture 112 is provided in face panel 90 between the outer ends of radial walls 100. As described below, in a preferred mode of operation, aperture 112 serves as an inlet through which process gases may be drawn into heated lid assembly 46 from one or more external gas sources.

Radial walls 101 extend generally radially from respective inner ends 102 to respective outer ends 104. Inner ends 102 are generally spaced apart from annular wall 96, while outer ends 104 are spaced apart from peripheral flange 82.

Radial walls 103 extend in spaced apart fashion from inner ends 105 radially outward and interconnect with peripheral flange 82. An aperture 114 is provided in face panel 90 between the outer ends of radial walls 103. As described below, in a preferred mode of operation, aperture 114 serves as an outlet through which process gases may be exhausted from heated lid assembly 46 and from heating unit 12 for collection, recycling, discarding, further processing, or the like.

A plurality of apertures 108 are formed in face panel 90 in the central region inside annular wall 96. For purposes of illustration, apertures 108 are arranged in a plurality of concentric circle arrays about the center of face panel 90. Of course, this particular arrangement is merely preferred and any pattern of one or more apertures may be used for the same or similar purposes, as desired. Collectively, in a preferred mode of operation, apertures 108 function as a showerhead-like device through which process gases are conveyed from inside heated lid assembly 46 into the process chamber 34 below heated lid assembly 46. Similarly, a plurality of apertures 110 are formed around the perimeter of face panel 90 proximal to peripheral flange 82. Collectively, in a preferred mode of operation, these apertures 110 provide ports through which process gases are withdrawn into heated lid assembly 46 from process chamber 34.

Radial walls 100, 101, and 103 and have respective top surfaces 106. When intermediate cover member 58 is secured to bottom cover member 80, these top surfaces 106 as well as top surfaces 85 and 98 sealingly seat against lower surface 66 of face panel 62. Consequently, the recessed areas among such raised features are able to function as channels and chambers of an inlet plenum system 116 and an exhaust plenum system 130. Inlet plenum system 116 provides chambers and pathways by which one or more process gases are brought into heated lid assembly 46 from one or more external sources and then conveyed into process chamber 34. Exhaust plenum system 130 provides chambers and pathways through which process gases are withdrawn into heated lid assembly 46 from process chamber 34.

In more detail, inlet plenum system includes aperture 112 through which one or more process gases may be supplied from one or more external sources into heated lid assembly 46 and then conveyed into process chamber 34. Suitable supply tubing, piping, or other suitable plumbing (not shown in FIGS. 1–5) may be coupled to aperture 112 via a device such as connector 120. Aperture 112 opens into a peripheral inlet chamber 122. From inlet chamber 122, the supplied gas is conveyed down radial inlet channel 124 to central inlet chamber 126. The gas is then discharged from central inlet chamber 126 through apertures 108. The supply gas(es) optionally may be placed under a suitable pressure to promote transport of the gas(es) through inlet plenum system 116 in this fashion. As seen best in FIG. 5, gas enters process chamber 34, generally flowing downward toward a central region of wafer 33. The gas then generally flows radially and symmetrically outward toward the periphery of process chamber 34. Proximal to the periphery of process chamber 34, the gas is withdrawn from process chamber 34 into the exhaust plenum system 130. Optionally, a vacuum may be applied to exhaust plenum system 130 to promote the flow of gas through system 130.

Referring again collectively to FIGS. 1 to 5, exhaust plenum system 130 includes exhaust plenum inlets 110 through which one or more process gases may enter heated lid assembly 46 from process chamber 34. These inlets 110 are positioned proximal to the outer periphery of the bottom cover member 80 and thereby introduce exhaust gas into outer exhaust plenum chambers 132 that also are positioned proximal to the outer periphery of bottom cover member 80. From outer exhaust plenum chambers 132, the exhaust gas is conveyed along a plurality of radial exhaust channels 136 into inner, annular exhaust chamber 142. Each radial channel 136 has a respective inlet 138 proximal to an outer exhaust plenum chamber 132 and a respective outlet 140 proximal to the inner, annular exhaust chamber 142. Preferably, the cross-sectional area of each inlet 138 is greater than the cross-sectional area of its corresponding outlet 140. That is, each of channels 136 tapers from the inlet to the outlet.

Radial exhaust channel 144 conveys exhaust gas from inner, annular exhaust chamber 142 to an outlet chamber 146, from which the exhaust gas is discharged from heating unit 12 through aperture 114. Aperture 114 may be coupled to suitable tubing, piping, or other plumbing via a suitable device such as connector 150.

Optionally, a suitable motivating force, such as a vacuum, may be applied in order to help transport exhaust gases through exhaust plenum system 130. When a vacuum is applied for this purpose, it has been observed that the radial exhaust channels 136 closest to radial exhaust channel 144 (which itself is closer to the downstream vacuum source) tend to experience the strongest vacuum. Consequently, if the cross-sectional areas of all of the outlets 140 were to be identical under these circumstances, the volumetric flow of exhaust gas through channels 136 that are closer to channel 144 would tend to be greater than the volumetric flows through channels 136 that are farther away. Such flow asymmetry could impact the uniformity by which thermal energy is transferred from heated lid assembly 146 to process chamber 34, hence to wafer 33.

Accordingly, to help enhance thermal uniformity, it is preferred if the cross-sectional areas of the channels 136 are varied as needed so that the volumetric flow of exhaust gas through channels 136 is as uniform as is practically desired. Generally, to achieve more symmetric flow through channels 136, it has been found that those outlets 140 farther from channel 144 will tend to be larger than those outlets 140 that are closer to channel 144.

One or more temperature sensors, such as thermistor 152, may be used to monitor the temperature of heated lid assembly 46. Such temperature sensor(s) may be coupled to a suitable control system to help control the output of heating device 68 at a desired set point temperature or the like. PID feedback and/or feedback control has been found to be suitable for this purpose. Slot 154 conveniently provides egress to the channel (not shown) in which thermistor 152 is housed. This slot 154 has been found to be useful when inserting, removing, and/or servicing thermistor 152.

The various components of processing station 10, and in particular the components of housing 31, may be formed from any suitable temperature resistant materials including metals (metals themselves, intermetallic compositions, alloys, and the like), polymer materials, ceramics, combinations of these, and the like. Preferably, housing components of thermal process unit 12 itself are formed from metal materials, such as aluminum, aluminum alloys, stainless steel, combinations of these, and the like. It is further preferable that each of the components to be welded to one another, if any, be of compatible metals to facilitate such welding. The result is a thermally and mechanically robust structure. Of course, for other applications, other materials may be suitable and other connection techniques may be utilized. For example, polymeric materials may be usable and adhesives may connect the components for processes carried out at sufficiently low processing temperatures. Mechanical fasteners, such as screws, bolts, rivets, and the like also may be used.

The relative difference in temperature between the heated platen 38 and the heated lid assembly 46 may impact the ease and accuracy by which the process temperature experienced by the wafer 33 can be controlled. Specifically, in some modes of practice, it has been observed that control of the process temperature is more difficult if the heated lid assembly 46 is too hot relative to the heated platen 38. In practical effect, "thermal cross-talk" is believed to occur between the lid assembly 46 and the heated platen 38. If such thermal cross-talk is observed as evidenced by, for instance, less accurate control of the platen and/or lid temperatures, the cross-talk generally can be alleviated by lowering the set point temperature of the heated lid assembly 46 relative to the temperature of the heated platen 38. To avoid or alleviate such cross-talk, it is preferred that the heated lid assembly 46 be maintained at a temperature that is from about 1° C. to about 50° C., more preferably about 5° C. to about 20° C., most preferably about 10° C. less than the temperature of the heated platen 38.

For purposes of the present invention, the temperature of the heated lid assembly 46 shall be deemed to be the temperature of the face panel 90 as measured by a temperature sensor in direct physical contact with face panel 90. Thus, with reference to FIG. 3, thermistor 152 is in direct physical contact with face panel 90 and thereby outputs a signal indicative of the temperature of heated lid assembly 46.

The design of heated lid assembly 46, and plenum systems 116 and 130 in particular, accomplishes multiple performance objectives. Firstly, it allows a radial flow of one or more process gases to be established in process chamber 34. This is illustrated schematically in FIG. 5. The symmetric, radial flow of gas over the surface of wafer 33 helps to promote uniform gas purge treatment of the wafer 33 across substantially the entirety of its top surface.

Secondly, flows of inlet and exhaust gases are generally quite symmetric, respectively, within heated lid assembly 46. Additionally, substantial, solid pathways for heat conduction from heating device 68 downward toward process chamber 34 are provided substantially symmetrically and uniformly within heated lid assembly 46 over the full surface area of face panel 62 as well. The symmetry of the gas flows and of the heat conduction pathways help to enhance the uniformity by which thermal energy is conveyed from heating device 68 into processing chamber 34. Surprisingly, the uniformly heated lid dramatically enhances thermal treatment of the wafer being heated within process chamber 34.

Figure 6:
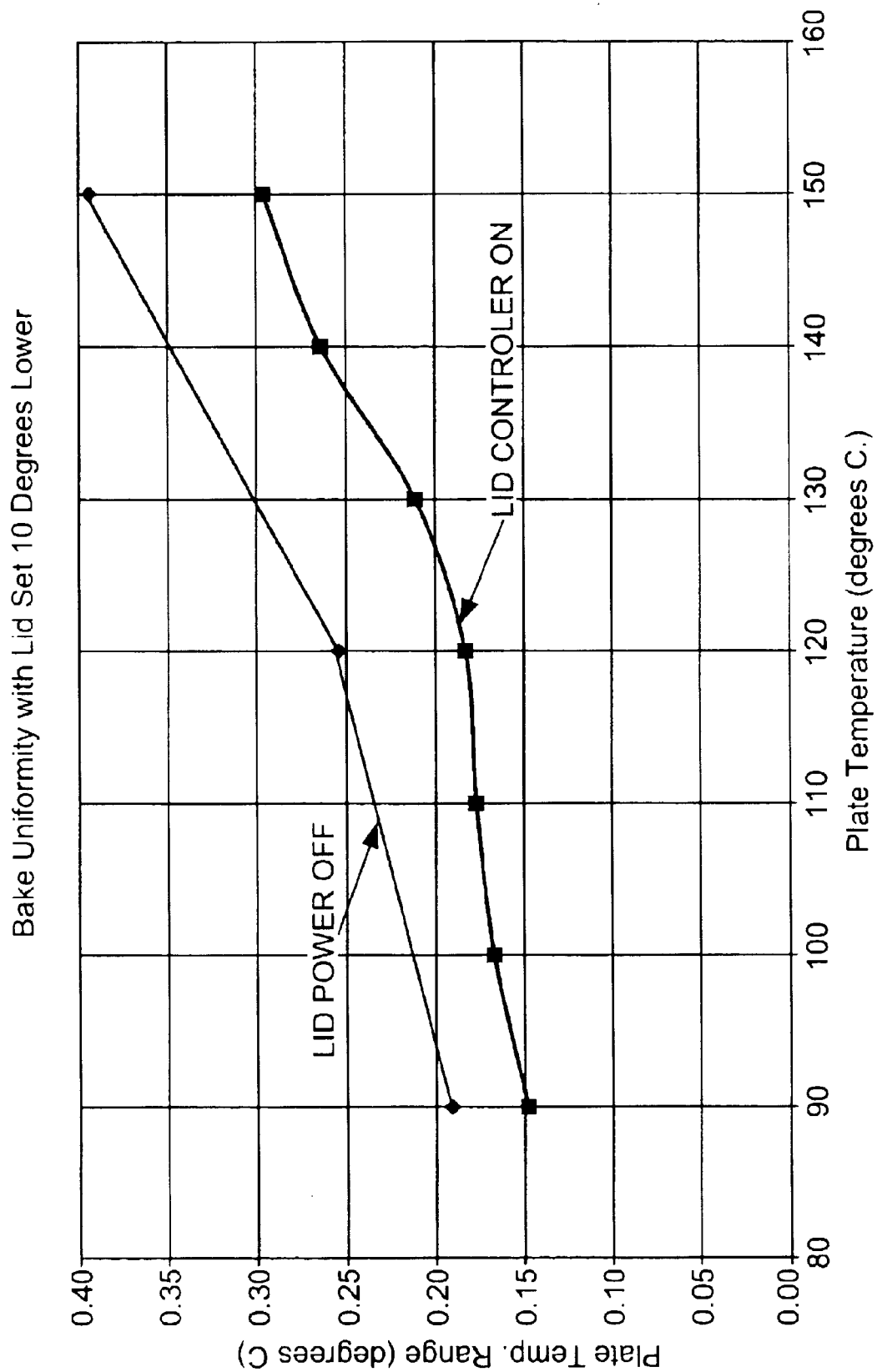
FIG. 6 is a graph showing the improved thermal uniformity of the thermal processing station of the present invention when the heated lid assembly is actively heated.

For example, FIG. 6 shows data in which thermal uniformity of a heated platen was measured both with and without active heating of the bakeplate lid. An apparatus constructed as shown in FIGS. 1 through 5 was used. In one experiment, the temperature range of the heated platen was measured as a function of the platen set point temperature with the power to the heated lid turned off (i.e., the lid is only passively heated by thermal energy from heated platen 38). In the other experiment, the temperature range of the heated platen was measured as a function of the platen set point temperature with the heated lid operated at a set point temperature that was 10° C. less than the set point temperature of the heated platen (i.e., the lid was actively heated by thermal energy from a heating device located within heated lid assembly 46). The data of FIG. 6 shows that, at any given platen set point temperature, the platen temperature was about at least 25% more uniform when the lid was actively heated.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A thermal process station for thermally processing a workpiece, the station comprising:

an enclosed process chamber in which a heated platen is positioned, the heated platen having a face over which the workpiece is positioned during a thermal treatment; and a lid assembly comprising:

a first stage comprising an additional heat source, the additional heat source being in thermally conductive contact with the process chamber; and a second stage comprising at least a portion of an inlet plenum system through which a gas is supplied to the process chamber and at least a portion of an exhaust plenum system through which a gas is exhausted from the process chamber, wherein at least one of the inlet and exhaust plenum systems comprises a plurality of radial flow channels.

2. The thermal process station of claim 1, wherein the inlet plenum system comprises a plurality of radial flow channels.

3. The thermal process station of claim 1, wherein the additional heat source comprises a planar heating device, and wherein the first stage further comprises a headspace above a top surface of the planar heating device.

4. The thermal process station of claim 3, wherein the planar heating device is adjacent a floor of the first stage.

5. The thermal process station of claim 1, wherein the first stage comprises a lid chamber in which the additional heat source is positioned.

6. The thermal process station of claim 1, wherein the additional heat source is spaced apart from the enclosed process chamber.

7. The thermal process station of claim 1, wherein the additional heat source is thermally coupled to the enclosed process chamber by a plurality of radial walls.

8. The thermal process station of claim 1, wherein a heating face of the additional heat source is opposed to the heated platen face.

9. The thermal process station of claim 1, further comprising:
a first gap between a major surface of the heated platen and a first major surface of the workpiece such that a heat flux from the heated platen to the first major surface of the workpiece flows across the first gap; and
a second gap between the additional heat source and a second major surface of the workpiece such that a heat flux from the additional heat source to the second major surface of the workpiece flows across the second gap.

10. A thermal process station for thermally processing a workpiece, the station comprising:
a housing comprising a heated lid assembly and a bottom housing assembly that closably engages the heated lid assembly;
a process chamber inside the housing defined at least in part by the heated lid assembly and the bottom housing assembly;
a lid chamber inside the heated lid assembly;
a heat source positioned inside the lid chamber in a manner such that the heat source is in thermal contact with the process chamber; and
a heated platen inside the process chamber on which the workpiece is supported during a thermal treatment.

11. The thermal process station of claim 10, wherein the heated lid assembly further comprises:
a first stage comprising the lid chamber; and
a second stage positioned between the first stage and the process chamber, the second stage comprising at least a portion of an inlet plenum system and at least a portion of an exhaust plenum system.

12. The thermal process station of claim 10, wherein the heated lid assembly further comprises:
an upper stage comprising the lid chamber, wherein the heat source positioned in the lid chamber is thermally coupled to a floor of the lid chamber; and
a lower stage comprising one or more walls that help to thermally couple the upper stage to the process chamber.

13. The thermal process station of claim 10, wherein the heat source is spaced apart from the process chamber.

14. The thermal process station of claim 13, wherein the heat source is thermally coupled to the process chamber by a plurality of radial walls.

15. The thermal process station of claim 10, further comprising:
a first gap between a major surface of the heated platen and a first major surface of the workpiece such that a heat flux from the heated platen to the first major surface of the workpiece flows across the first gap; and
a second gap between the heat source and a second major surface of the workpiece such that a heat flux from the heat source to the second major surface of the workpiece flows across the second gap.

16. A thermal process station for thermally processing a workpiece, the station comprising:
a heated lid assembly closeably engaging a bottom housing assembly;
a processing chamber defined at least in part by the bottom housing assembly;
at least a portion of an inlet plenum system in the heated lid assembly comprising a gas flow path in fluid communication with the processing chamber; and
at least a portion of an exhaust plenum system in the heated lid assembly comprising a gas flow path in fluid communication with the process chamber, wherein at least one of the inlet and exhaust plenum systems comprises a plurality of radial flow channels.

17. The thermal process station of claim 16, wherein at least a portion of the radial flow channels differ dimensionally from each other.

18. The thermal process station of claim 16, wherein the heated lid assembly further comprises:
a lid chamber comprising;
a heat source positioned in the lid chamber; and
a headspace above a top surface of the heat source.

19. The thermal process station of claim 18, further comprising:
a heated platen inside the processing chamber on which the workpiece is supported during a thermal treatment;
a first gap between a major surface of the heated platen and a first major surface of the workpiece such that a heat flux from the heated platen to the first major surface of the workpiece is across the first gap; and
a second gap between the heat source and a second major surface of the workpiece such that a heat flux from the heat source to the second major surface of the workpiece flows across the second gap.

20. A method of improving the thermal uniformity of a workpiece during a thermal treatment, comprising the steps of:
providing a first heat source having a first heating face;
providing a second heat source having a second heating face, wherein the first and second heating faces are opposed to each other such that at least part of the space between the first and second heat source define a process chamber;
providing an inlet plenum system comprising a gas flow path in fluid communication with the process chamber and an exhaust plenum system comprising a gas flow path in fluid communication with the process chamber, wherein at least one of the inlet and exhaust plenum systems comprises a plurality of radial flow channels; and
positioning the workpiece between the first and second, opposed heating faces during at least a portion of the thermal treatment.

21. A thermal process station for thermally processing a workpiece, the station comprising:
an enclosed process chamber in which a heated platen is positioned, the heated platen having a face over which the workpiece is positioned during a thermal treatment; and a lid assembly comprising:
  a first stage comprising a lid chamber in which an additional heat source is positioned, the additional heat source being in thermally conductive contact with the process chamber; and
  a second stage comprising at least a portion of an inlet plenum system through which a gas is supplied to the process chamber and at least a portion of an exhaust plenum system through which a gas is exhausted from the process chamber, wherein the second stage is positioned between the first stage and the enclosed process chamber, wherein at least one of the inlet and exhaust plenum systems comprises a plurality of radial flow channels, and wherein the radial flow channels differ dimensionally from each other.

* * * * *